(12) United States Patent
Park et al.

(10) Patent No.: US 8,241,939 B2
(45) Date of Patent: Aug. 14, 2012

(54) SEMICONDUCTOR NANOWIRE SENSOR DEVICE AND METHOD FOR MANUFACTURING THE SAME

(75) Inventors: Chan Woo Park, Daejeon (KR); Chang Geun Ahn, Daejeon (KR); Jong Heon Yang, Daejeon (KR); In Bok Baek, Cheongju (KR); Chil Seong Ah, Daejeon (KR); Han Young Yu, Daejeon (KR); An Soon Kim, Daejeon (KR); Tae Youb Kim, Seoul (KR); Moon Gyu Jang, Daejeon (KR); Myung Sim Jun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 187 days.

(21) Appl. No.: 12/682,571

(22) PCT Filed: Jul. 24, 2008

(86) PCT No.: PCT/KR2008/004331
§ 371 (c)(1),
(2), (4) Date: Apr. 9, 2010

(87) PCT Pub. No.: WO2009/072722
PCT Pub. Date: Jun. 11, 2009

(65) Prior Publication Data
US 2010/0270530 A1    Oct. 28, 2010

(30) Foreign Application Priority Data

Dec. 5, 2007  (KR) .................. 10-2007-0125679

(51) Int. Cl.
*H01L 21/00* (2006.01)
*H01L 29/06* (2006.01)
(52) U.S. Cl. .............. 438/48; 438/49; 257/9; 257/98; 257/E51.023; 257/E51.04; 257/E51.051; 977/710; 977/720; 977/728; 977/786; 977/860; 977/938

(58) Field of Classification Search .............. 257/9, 98, 257/347, E51.023, E51.04, E51.051; 977/710, 977/720, 728, 786, 860, 938; 438/48, 49
See application file for complete search history.

(56) References Cited

U.S. PATENT DOCUMENTS 6,870,235 B2    3/2005    Abstreiter et al.
(Continued)

FOREIGN PATENT DOCUMENTS

JP    2006-242900 A    9/2006
(Continued)

OTHER PUBLICATIONS

Eric Stern et al., "Label-free immunodetection with CMOS-compatible semiconducting nanowires," Nature, Feb. 1, 2007, pp. 519-522, vol. 445, 2007 Nature Publishing Group.
Yi Cui et al., "Nanowire Nanosensors for Highly Sensitive and Selective Detection of Biological and Chemical Species," Science, Aug. 17, 2001, pp. 1289-1292, vol. 293, American Association for the Advancement of Science.
(Continued)

*Primary Examiner* — Long Tran (57) ABSTRACT

A method for manufacturing a biosensor includes forming a silicon nanowire channel, etching a first conductivity-type single crystalline silicon layer which is a top layer of a Silicon-On-Insulator (SOI) substrate to form a first conductivity-type single crystalline silicon line pattern, doping both sidewalls of the first conductivity-type single crystalline silicon line pattern with impurities of a second conductivity-type opposite to the first conductivity-type to form a second conductivity-type channel, forming second conductivity-type pads for forming electrodes at both ends of the first conductivity-type single crystalline silicon line pattern, forming, in an undoped region of the first conductivity-type single crystalline silicon line pattern, a first electrode for applying a reverse-bias voltage to insulate the first conductivity-type single crystalline silicon line pattern and the second conductivity-type channel from each other, and forming second electrodes for applying a bias voltage across the second conductivity-type channel on the second conductivity-type pad.

18 Claims, 9 Drawing Sheets

U.S. PATENT DOCUMENTS

| | | | |
|---|---|---|---|
| 7,893,492 B2 * | 2/2011 | Bedell et al. | 257/346 |
| 2006/0054936 A1 | 3/2006 | Lieber et al. | |
| 2006/0154489 A1 | 7/2006 | Tornow et al. | |

FOREIGN PATENT DOCUMENTS

| | | |
|---|---|---|
| KR | 1020040107225 A | 12/2004 |
| KR | 1020080050958 A | 6/2008 |
| KR | 1020080050985 A | 6/2008 |

OTHER PUBLICATIONS

Ansoon Kim et al., "Ultrasensitive, label-free, and real-time immunodetection using silicon field-effect transistors," Applied Physics Letters, Jun. 13, 2007, pp. 103901-1-3, 2007 American Institute of Physics.

International Search Report for PCT/KR2008/004331 filed on Jul. 24, 2008.

* cited by examiner

SEMICONDUCTOR NANOWIRE SENSOR DEVICE AND METHOD FOR MANUFACTURING THE SAME

TECHNICAL FIELD

The present invention relates to a method of manufacturing a biosensor device, and more particularly, to a method of manufacturing a biosensor capable of detecting a specific bio material through mutual reaction between a probe molecule and a target material occurring on the surface of a silicon nanowire channel having a line width of several nanometers to several tens of nanometers.

The present invention is derived from research supported by the IT R&D program of the Ministry of Information and Communication and the Institute for Information Technology Advancement (MIC/IITA) in Korea (Project docket No.: 2006-S-007-02, project title: Ubiquitous Health Monitoring Module and System Development).

BACKGROUND ART

In recent years, a nano biosensor for detecting proteins in blood has been a major topic in the research of fusion technologies that combine biotechnologies and nanotechnologies.

This research has led to the proposal of biosensors based on silicon technology that would allow mass production using semiconductor processes. One such biosensor is a silicon nanowire biosensor which uses silicon nanowires to quantitatively detect and analyze specific biomaterials.

The silicon nanowire biosensor senses a change in channel electrical conductivity resulting from binding between a charged target material and a probe molecule fixed on the surface of an electrical channel composed of silicon nanowires. Unlike a fluorescent labeling method commonly employed at present, the silicon nanowire biosensor can simultaneously sense various materials within a sample with high sensitivity, in real time, and without additional biochemical processing of the sample to be measured.

Figure 1:
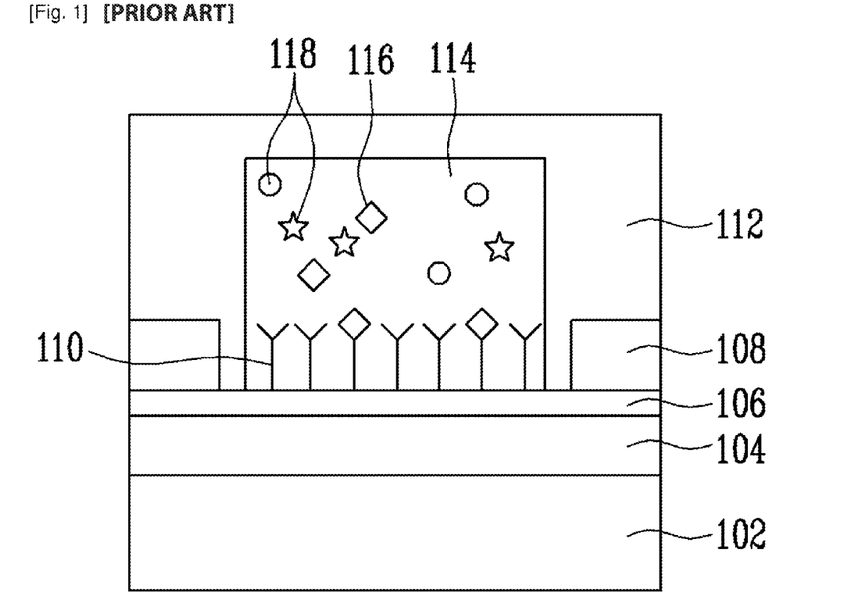
FIG. 1 illustrates a conventional silicon nanowire biosensor.

FIG. 1 illustrates a conventional silicon nanowire biosensor.

Referring to FIG. 1, a silicon nanowire channel 106 where current flows is electrically separated from a bottom substrate 102 by an insulating layer 104, and probe molecules 110 are fixed on the surface of the silicon nanowire channel 106.

A sample 114 injected into the biosensor through a fluidic channel 112 may be gaseous or liquid and includes a target material 116 which is specifically bound to the probe molecules 110 already fixed on the surface of the silicon nanowire channel 106, and nonspecific molecules 118 which are not bound to the probe molecule 110.

The binding of the target material 116 within the injected sample 114 to the probe molecules 110 fixed on the surface of the nanowire channel 106 changes the surface potential of the nanowire channel 106, which changes its band structure.

This changes the charge distribution within the nanowire channel 106, which changes the electrical conductivity of the nanowire channel 106.

The change in electrical conductivity can be measured using a specific processor coupled to the nanowire channel through the electrode 108 to thereby detect the target material 116 within the sample 114.

A bottom-up approach such as a vapor-liquid-solid (VLS) growth method was initially employed to fabricate the silicon nanowire. However, it was difficult to align the nanowires at a desired position, and thus such a bottom-up approach was not conducive to device reproducibility and reliability.

In response to this problem, semiconductor microfabrication technology taking a top-down approach, such as lithography and etching, was recently proposed to pattern the nanowire on a silicon-oxide-insulator (SOI) substrate and use the patterned nanowire as a channel to detect a bio material.

However, the line width of the nanowire used as the channel must have a value of several nanometers to several tens of nanometers in order to detect the bio material with high sensitivity. Such a narrow line width requires a nano patterning technology such as electron beam lithography, which is costly and inefficient.

DISCLOSURE OF INVENTION

Technical Problem

An object of the present invention is to provide a method of manufacturing a semiconductor nanowire sensor device which uses a typical photolithography process to form a silicon nanowire channel with a line width of several nanometers to several tens of nanometers.

Other objects, features and advantages of the present invention are made apparent in the following description of exemplary embodiments of the present invention.

Technical Solution

One aspect of the present invention provides a method of manufacturing a semiconductor nanowire sensor device, including: etching a first conductivity-type single crystalline silicon layer which is a top layer of a Silicon-On-Insulator (SOI) substrate to form a first conductivity-type single crystalline silicon line pattern; doping both sidewalls of the first conductivity-type single crystalline silicon line pattern with impurities of a second conductivity-type opposite to the first conductivity-type to form a second conductivity-type channel; forming second conductivity-type pads for forming electrodes at both ends of the first conductivity-type single crystalline silicon line pattern; forming, in an undoped region of the first conductivity-type single crystalline silicon line pattern, a first electrode for applying a reverse-bias voltage to insulate the first conductivity-type single crystalline silicon line pattern and the second conductivity-type channel from each other; and forming a second electrode for applying a bias voltage across the second conductivity-type channel on the second conductivity-type pad.

In an exemplary embodiment, the etching of the first conductivity-type single crystalline silicon layer may include: forming a photoresist line pattern on the first conductivity-type single crystalline silicon layer; and dry-etching the first conductivity-type single crystalline silicon layer using the photoresist line pattern as an etch mask to form the first conductivity-type single crystalline silicon line pattern.

The doping of the both sidewalls of the first conductivity-type single crystalline silicon line pattern may include: reducing width of the photoresist line pattern using an isotropic oxygen plasma etching process to form an exposed region in which a portion of a top surface of the first conductivity-type single crystalline silicon layer pattern is exposed; and doping the exposed region with impurities of a second conductivity-type to form the second conductivity-type channel.

In another exemplary embodiment, the etching of the first conductivity-type single crystalline silicon layer may include: forming on the first conductivity-type single crystalline silicon layer a passivation layer which blocks ion implantation and can be removed by wet-etching; forming a photoresist line pattern on the passivation layer; dry-etching the passivation layer using the photoresist line pattern as an etch mask to form a passivation layer line pattern; dry-etching the first conductivity-type single crystalline silicon layer using the photoresist line pattern as an etch mask to form the first conductivity-type single crystalline silicon line pattern; and removing the photoresist line pattern.

The doping of the both sidewalls of the first conductivity-type single crystalline silicon line pattern may include: reducing width of the passivation layer line pattern using an isotropic wet etching process to form an exposed region in which a portion of a top surface of the first conductivity-type single crystalline silicon layer pattern is exposed; and doping the exposed region with impurities of a second conductivity-type to form the second conductivity-type channel.

Another aspect of the present invention provides a semiconductor nanowire sensor device including: a substrate; an oxide layer formed on the substrate; a first conductivity-type single crystalline silicon line pattern formed lengthwise on one region of the oxide layer; a second conductivity-type channel formed at both sidewalls of the first conductivity-type single crystalline silicon line pattern, the second conductivity-type being opposite the first conductivity-type; second conductivity-type pads formed at both ends of the first conductivity-type single crystalline silicon line pattern; a first electrode formed on one region of the first conductivity-type single crystalline silicon line pattern; a second electrode formed on the second conductivity-type pad; and a probe molecule formed on the second conductivity-type channel for binding with a target material, wherein the first conductivity-type single crystalline silicon line pattern and the second conductivity-type channel are insulated by a reverse-bias voltage applied to the first electrode.

Advantageous Effects

As described above, the present invention has the following advantages:

First, a silicon nanowire channel with a line width of several nanometers to several tens of nanometers can be formed by a typical photolithography process for use in a semiconductor nanowire sensor.

Second, a reproducible and highly sensitive semiconductor nanowire sensor device can be mass produced at low cost and high efficiency.

MODE FOR THE INVENTION

Hereinafter, exemplary embodiments of the present invention will be described in detail. For the sake of clarity and concision, descriptions of well-known functions and configurations will be omitted. In the following, when a layer (or structure) is described as being on another layer (or structure), the layer may be formed directly on the other layer or a third layer or layers may be interposed therebetween.

FIGS. 2 to 9 illustrate a method of manufacturing a semiconductor nanowire sensor according to an exemplary embodiment of the present invention. The method will now be described with reference to these figures.

Figure 2:
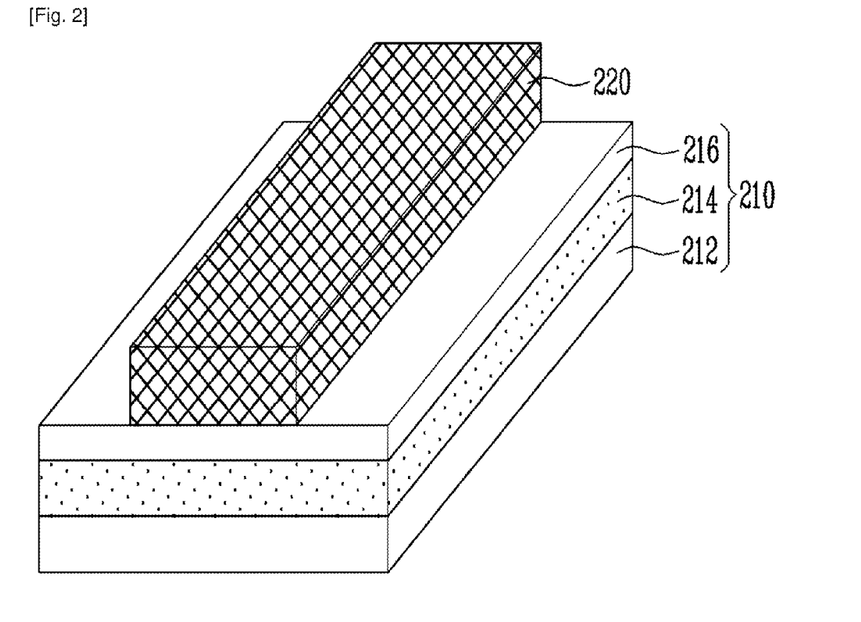
FIGS. 2 to 9 illustrate a method of manufacturing a semiconductor nanowire sensor according to an exemplary embodiment of the present invention.

First, a photoresist line pattern 220 is formed on an SOI substrate 210 composed of a silicon substrate layer 212, a buried oxide layer 214 and a first conductivity-type single crystalline silicon layer 216, as shown in FIG. 2. Preferably, the photoresist line pattern 220 is formed to have a line width of about 1 to 100 micrometers using a photolithography process.

Figure 3:
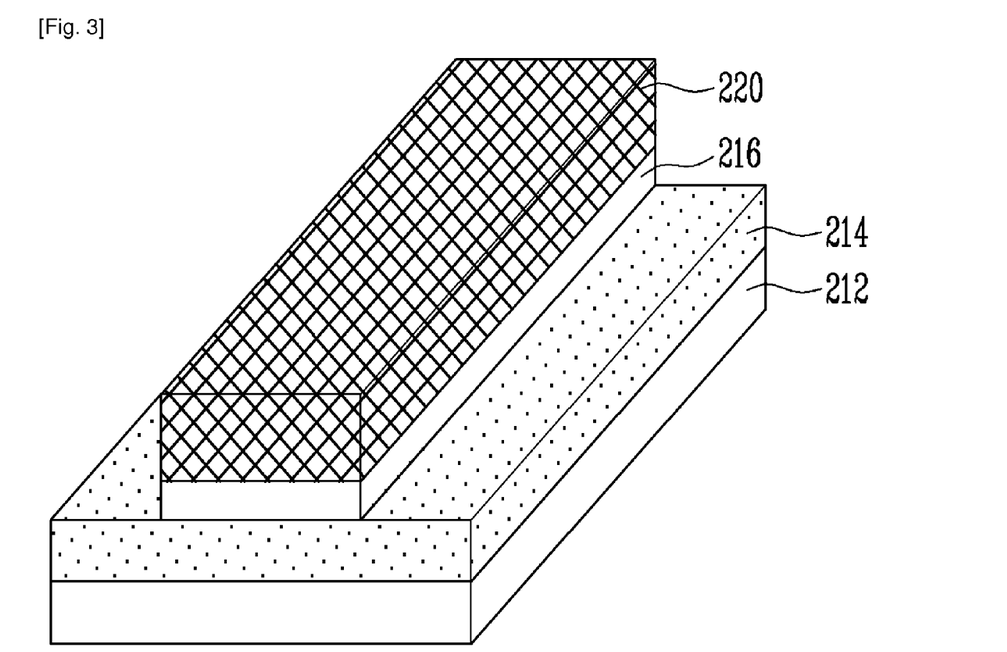

The photoresist line pattern 220 is then used as an etch mask to dry-etch the first conductivity-type single crystalline silicon layer 216, as shown in FIG. 3. Here, an etching selectivity of the buried oxide layer 214 with respect to the first conductivity-type single crystalline silicon layer 216 is made to be sufficiently high so that the buried oxide layer 214 is not lost.

Figure 4:
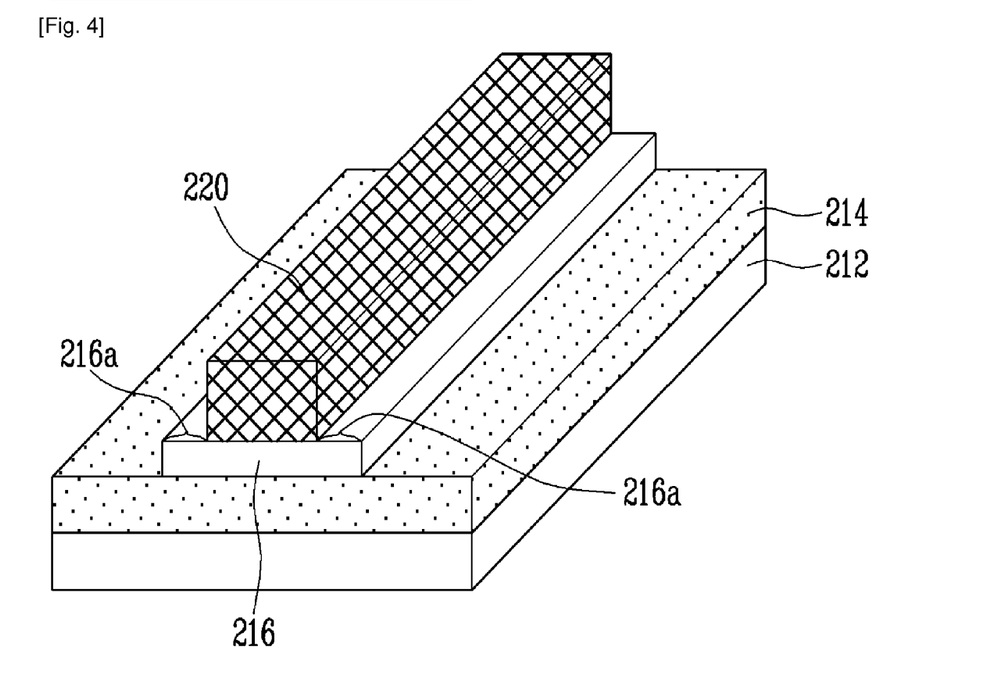

The width of the photoresist line pattern 220 is reduced by an etching process at both sidewalls of the photoresist line pattern 220, to form an exposed region 216a in which a portion of a top surface of the first conductivity-type single crystalline silicon layer is exposed, as shown in FIG. 4. Here, the etching selectivity of the first conductivity-type single crystalline silicon layer 216 with respect to the photoresist line pattern 220 is made to be sufficiently high so that the first conductivity-type single crystalline silicon layer 216 is not lost. Here, it is preferable to etch the photoresist line pattern 220 to give the exposed region 216a a width of about 1 to 100 nanometers.

Figure 5:
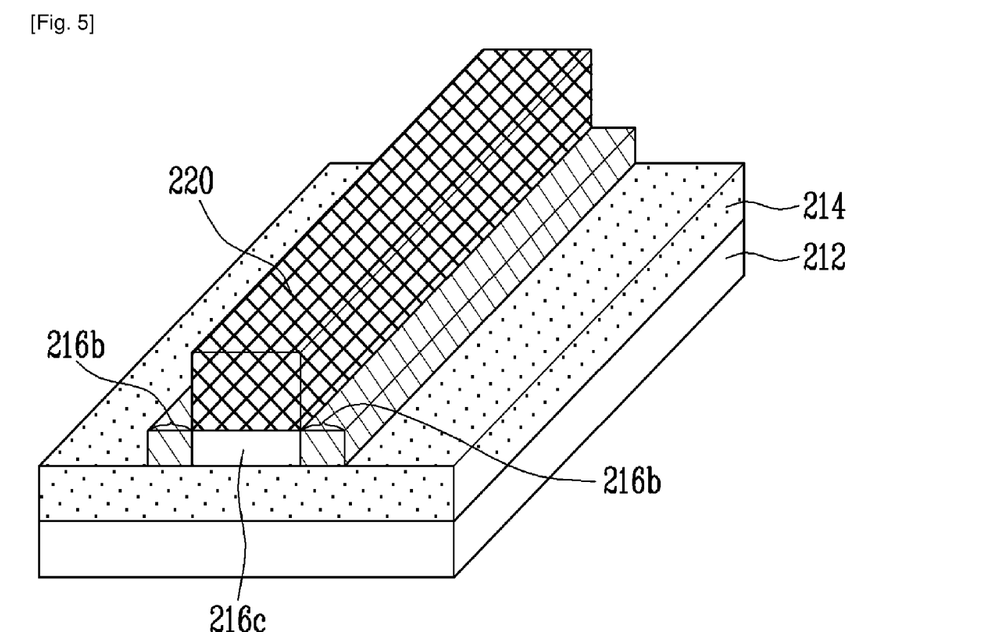

The exposed region 216a is then doped with impurities of a second conductivity-type to form a second conductivity-type channel 216b, as shown in FIG. 5. That is, the second conductivity-type channel 216b is P-type when the first conductivity-type single crystalline silicon layer 216 is N-type, and vice versa.

The goal is to electrically separate an undoped region 216c of the first conductivity-type single crystalline silicon layer from the second conductivity-type channel 216b by means of insulation when a reverse-bias voltage is applied between the undoped region 216c and the channel 216b. This has the same electrical effect as separating the second conductivity-type channel 216b from the silicon substrate layer 212 by the buried oxide layer 214.

The doping with the second conductivity-type ions may be carried out by an ion implantation method. Afterwards, it is preferable to remove defects generated by doping and thermally treat the doped region to activate the implanted ions.

Figure 6:
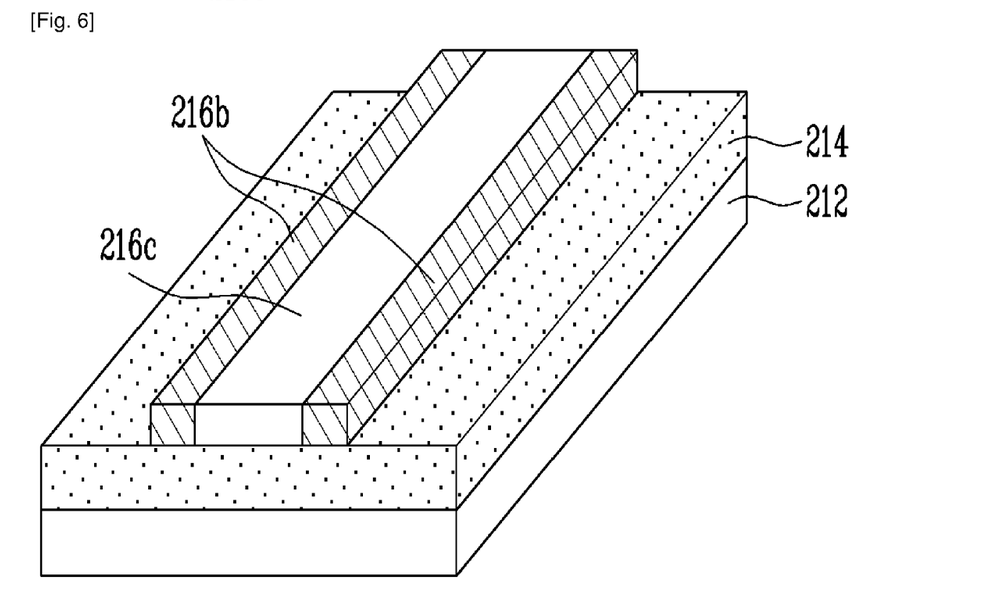

The photoresist line pattern 220 is then removed, as shown in FIG. 6.

Figure 7:
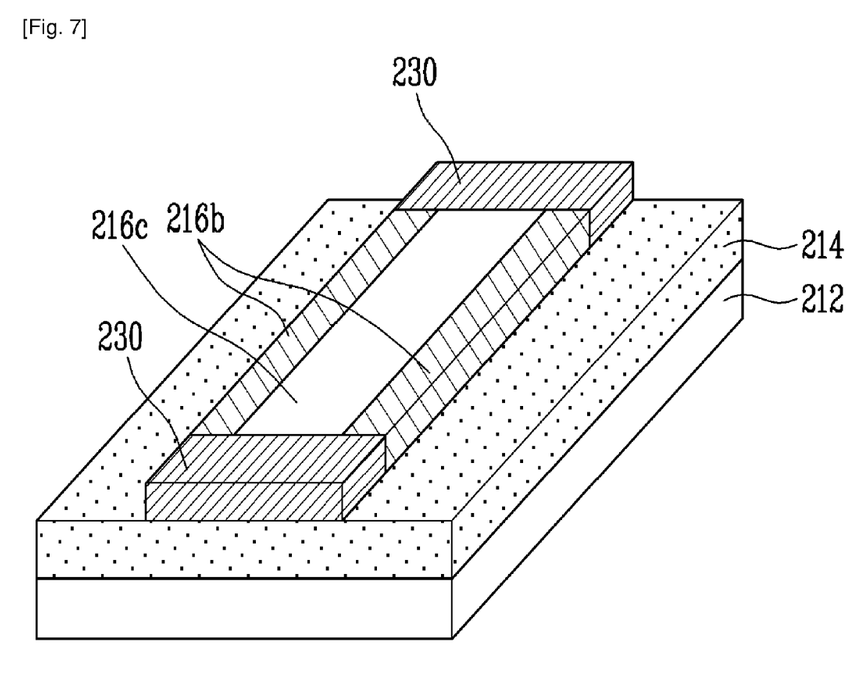

A second conductivity-type pad region 230 for forming an electrode is formed at both ends of the second conductivity-type channel 216b by a photolithography process, an ion implantation process, and a photoresist removal process, as shown in FIG. 7.

In detail, after the photoresist is formed by a photolithography process on a region except where the second conductivity-type pad region 230 is to be formed, the photoresist is used as a mask to form the second conductivity-type pad region 230 using an ion implantation method.

It is preferable to remove the photoresist and defects caused by the doping and thermally treat the doped region to activate the implanted ions.

Figure 8:
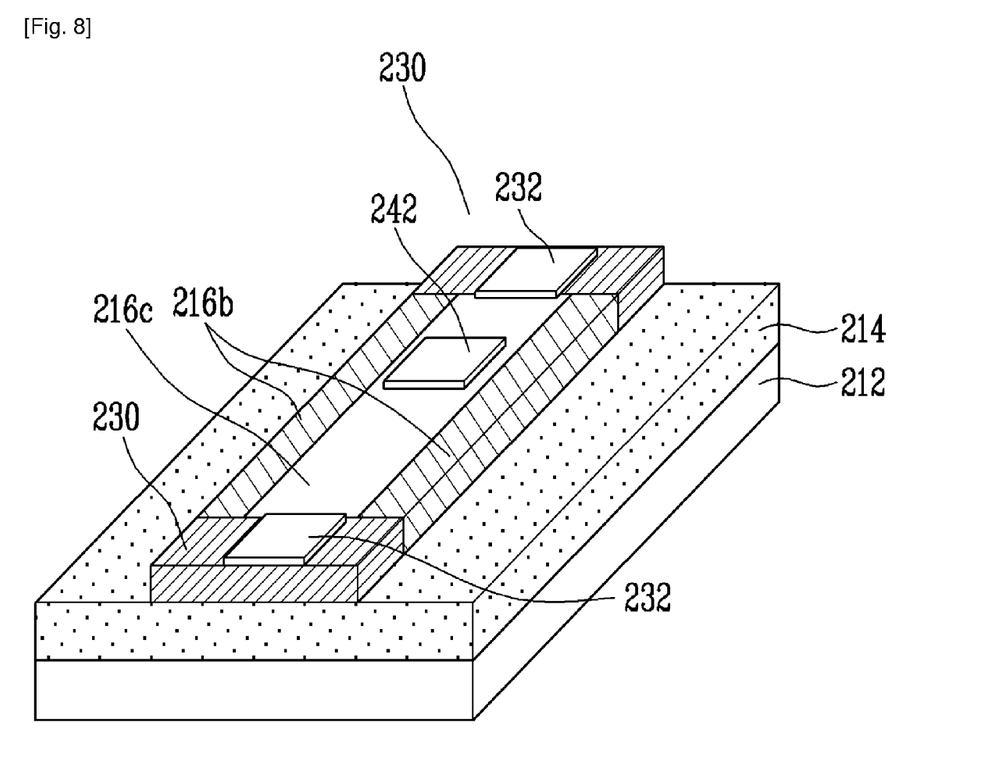

Electrodes 232 and 242 are then formed in the second conductivity-type pad region 230 and the undoped region 216c of the first conductivity-type single crystalline silicon layer, as shown in FIG. 8.

Here, the electrodes 232 formed in the second conductivity-type pad region 230 apply a bias voltage across the second conductivity-type channel 216b causing current to flow, and the electrode 242 formed in the first conductivity-type single crystalline silicon layer 216 applies a reverse-bias voltage between the second conductivity-type channel 216b and the undoped region 216c of the first conductivity-type single crystalline silicon layer 216 so that the channel 216b and the undoped region 216c are insulated (electrically separated) from each other.

The electrodes 232 and 242 are preferably formed of materials having an ohmic contact with the undoped region 216c of the first conductivity-type single crystalline silicon layer and the second conductivity-type channel 216b, respectively. The ohmic contact allows a voltage externally applied and a current flowing through the second conductivity-type channel 216b to be linearly proportional. When the ohmic contact is not formed, the voltage-current relationship is nonlinear, which is unsuitable for a reliable sensor.

The material for forming the ohmic contact may be selected from the group consisting of doped polysilicon, metal, conductive metal nitride, and metal silicide.

Figure 9:
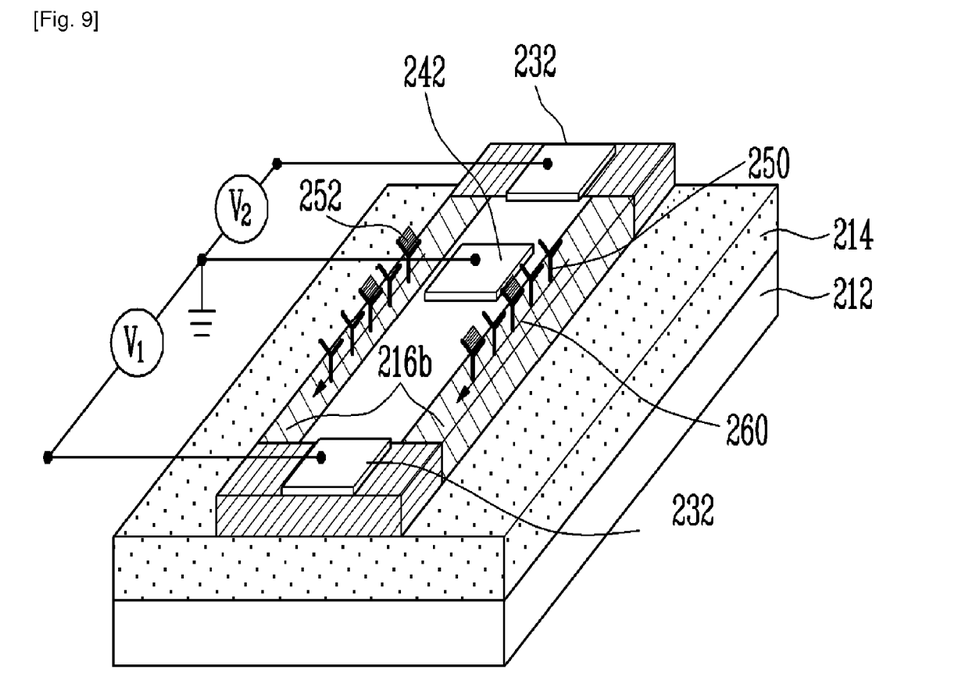

A probe molecule 250 is then fixed to the surface of the second conductivity-type channel 216b, as shown in FIG. 9. When target materials 252 are supplied to be bound with the probe molecules 250 while a proper bias voltage is applied to the electrode 232, the channel current 260 flowing through the second conductivity-type channel 216b is changed by the electrical charge supplied by the target materials 252 such that the amount of the target materials 252 present can be sensed.

Here, the probe molecules 250 may be selected from the group consisting of an antigen, an antibody, a DNA, a protein, and a combination thereof.

Figure 10:
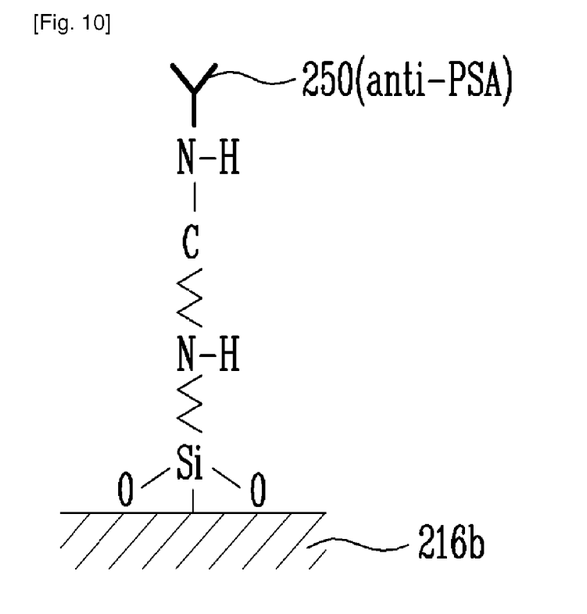
FIG. 10 illustrates a probe molecule fixed on a second conductivity-type channel.

FIG. 10 illustrates the probe molecule 250 fixed on the second conductivity-type channel 216b. Anti-Prostate Specific Antigen (PSA) capable of detecting the PSA was employed as the probe molecule 250.

A hydroxyl functional group (—OH) is first formed on the surface of the second conductivity-type channel 216b through $O_2$ plasma ashing. The second conductivity-type channel 216b is then immersed in an ethanol solution in which 1% aminopropyltriethyoxy silane (APTES) is dispersed, agitated for a predetermined time, cleaned and dried. A 25 wt. % glutaraldehyde solution is used to form an aldeyhde functional group (—CHO). The aldehyde functional group and the anti-PSA are then bound through reaction within the anti-PSA solution, thereby fixing the anti-PSA as the probe molecules 250 on the surface of the second conductivity-type channel 216b.

FIGS. 11 to 15 illustrate a method of manufacturing a semiconductor nanowire sensor according to another exemplary embodiment of the present invention.

Figure 11:
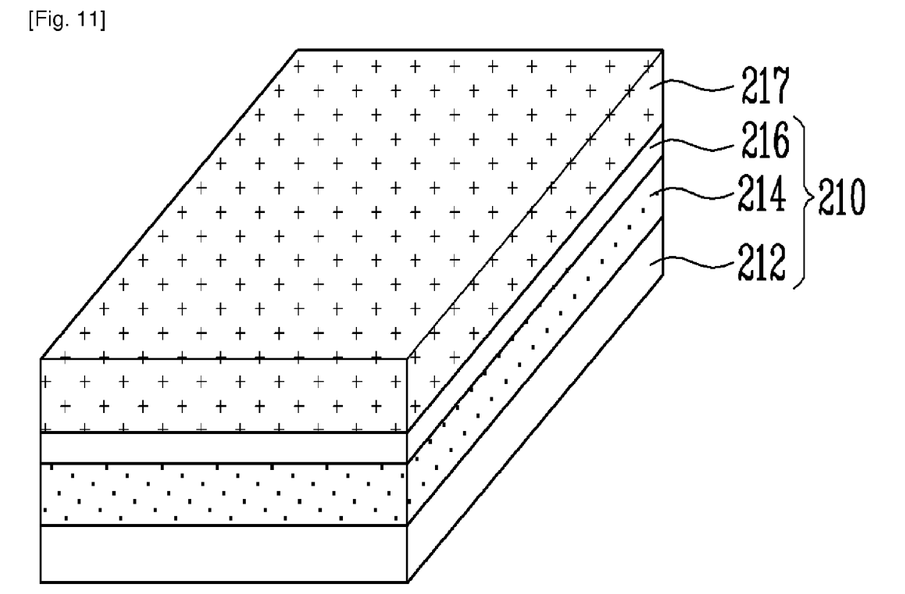
FIGS. 11 to 15 illustrate a method of manufacturing a semiconductor nanowire sensor according to another exemplary embodiment of the present invention.

A passivation layer 217 is formed on an SOI substrate 210 composed of a silicon substrate layer 212, a buried oxide layer 214, and a first conductivity-type single crystalline silicon layer 216, as shown in FIG. 11.

The passivation layer 217 is formed of a material which can block ion implantation and can be removed by wet-etching. For example, an oxide layer and a nitride layer having a thickness of 10 to 1000 nanometers may be employed for the passivation layer 217.

Figure 12:
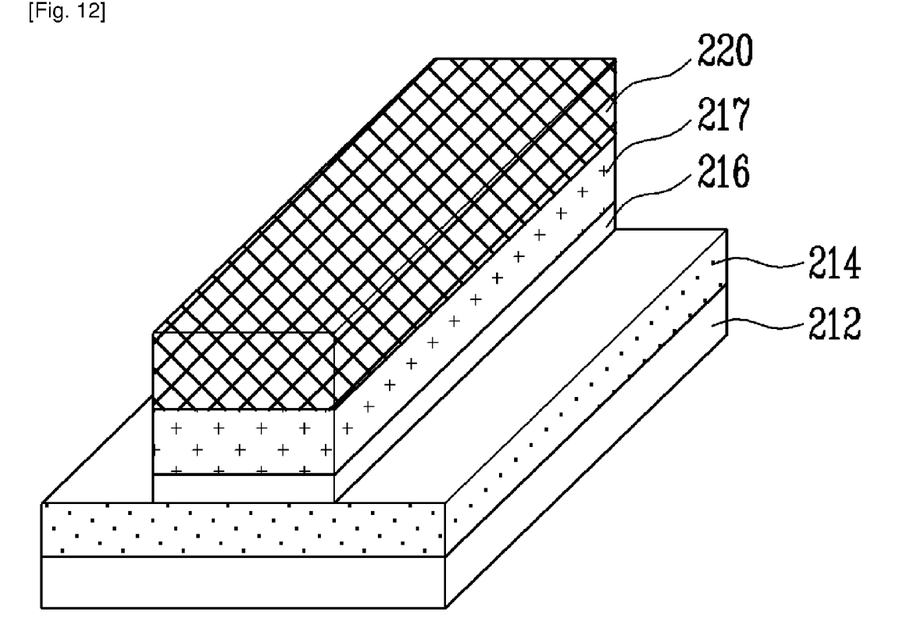

The photoresist line pattern 220 is then formed on the passivation layer 217 using a photolithography process, and is used as an etch mask to sequentially dry-etch the passivation layer 217 and the first conductivity-type single crystalline silicon layer 216. The line width of the photoresist line pattern 220 is preferably 1 to 100 micrometers.

Figure 13:
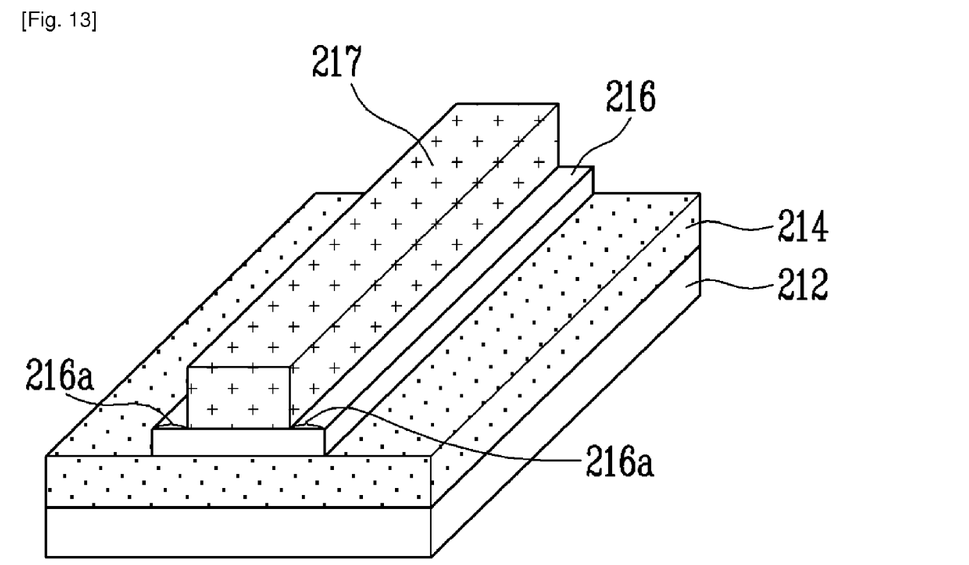

After the photoresist line pattern 220 is removed, as shown in FIG. 13, the line width of the passivation layer 217 is reduced to 1 to 100 nanometers by wet-etching so that an exposed region 216a, which is a portion of a top surface of the first conductivity-type single crystalline silicon layer 216, is formed at both sidewalls of the passivation layer 217. Here, the etching selectivity of the first conductivity-type single crystalline silicon layer 216 with respect to the passivation layer 217 is made to be sufficiently high so that the first conductivity-type single crystalline silicon layer 216 is not lost.

Figure 14:
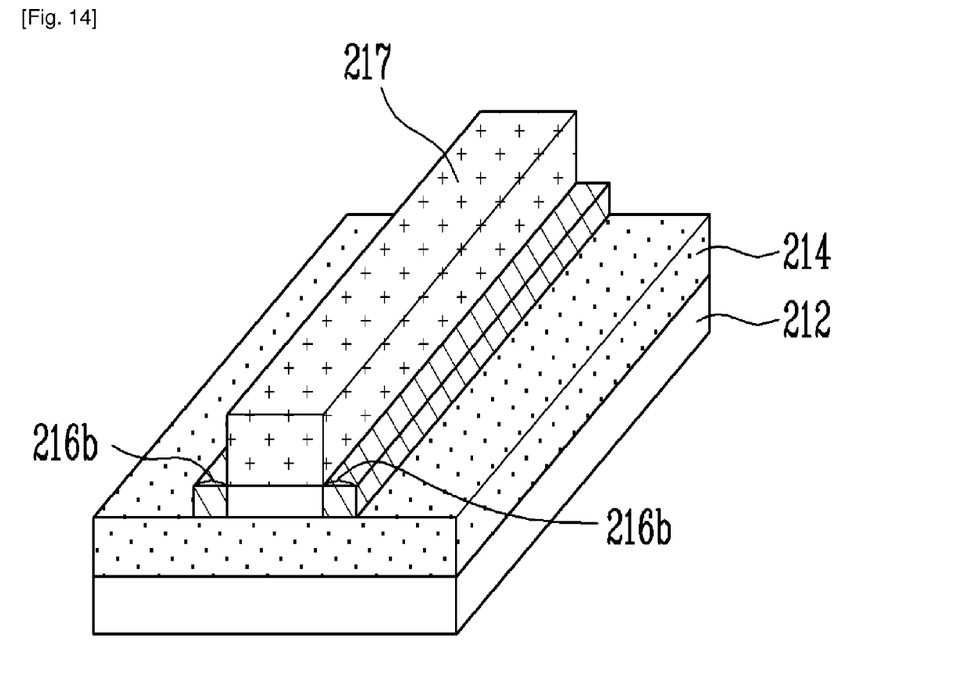
Figure 15:
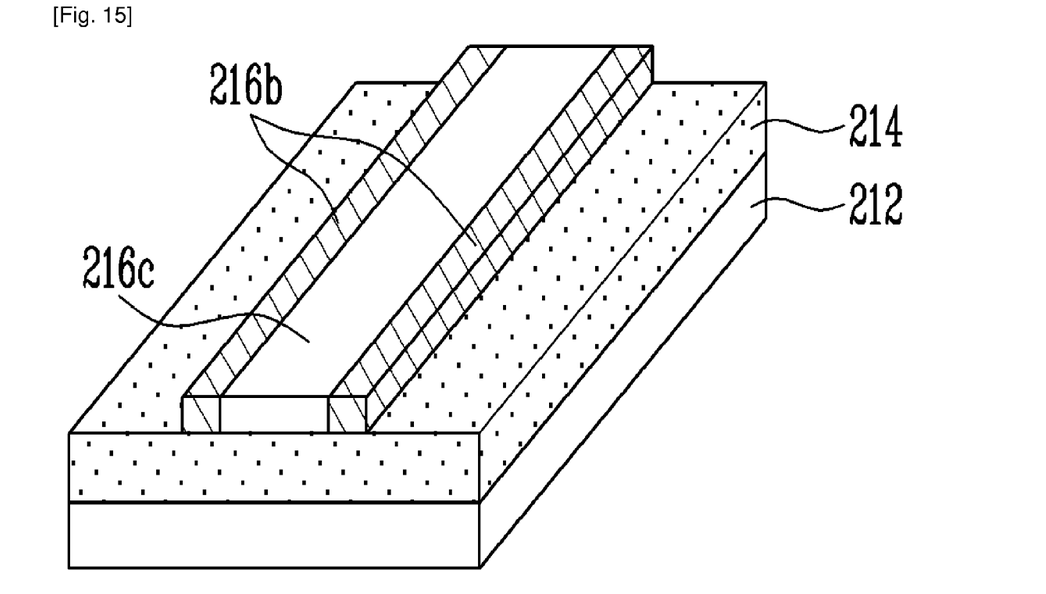

The exposed region 216a of the first conductivity-type single crystalline silicon layer 216 is doped with impurities of a second conductivity-type by an ion implantation method to form a second conductivity-type channel 216b, as shown in FIG. 14. The second conductivity-type channel 216b is P-type when the first conductivity-type single crystalline silicon layer 216 is N-type, and vice versa. The aim is to electrically separate an updoped region 216c of the first conductivity-type single crystalline silicon layer from the second conductivity-type channel 216b by means of insulation when a reverse-bias voltage is applied between the undoped region 216c and the channel 216b. This has the same electrical effect as separating the second conductivity-type channel 216b from the silicon substrate layer 212 by the buried oxide layer 214.

After the doping is carried out by the ion implantation method, it is preferable to remove defects caused by the doping and thermally treat the doped region to activate the implanted ions.

When the passivation layer 217 is subsequently removed, the resulting structure is as shown in FIG. 6, and the subsequent processes are carried out as described above with reference to FIGS. 7 to 10.

According to the present invention as described above, a typical photolithography process may be advantageously employed to manufacture a semiconductor nanowire sensor device without need of costly and inefficient nano patterning technology such as electron beam lithography.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A method of manufacturing a semiconductor nanowire sensor device, comprising:
    etching a first conductivity-type single crystalline silicon layer which is a top layer of a Silicon-On-Insulator (SOI) substrate to form a first conductivity-type single crystalline silicon line pattern;
    doping both sidewalls of the first conductivity-type single crystalline silicon line pattern with impurities of a second conductivity-type opposite to the first conductivity-type to form a second conductivity-type channel;
    forming second conductivity-type pads for forming electrodes at both ends of the first conductivity-type single crystalline silicon line pattern;
    forming, in an undoped region of the first conductivity-type single crystalline silicon line pattern, a first electrode for applying a reverse-bias voltage to insulate the first conductivity-type single crystalline silicon line pattern and the second conductivity-type channel from each other; and forming a second electrode for applying a bias voltage across the second conductivity-type channel on the second conductivity-type pad.

2. The method according to claim 1, wherein the etching of the first conductivity-type single crystalline silicon layer comprises:

forming a photoresist line pattern on the first conductivity-type single crystalline silicon layer; and dry-etching the first conductivity-type single crystalline silicon layer using the photoresist line pattern as an etch mask to form the first conductivity-type single crystalline silicon line pattern.

3. The method according to claim 2, wherein the forming of the photoresist line pattern comprises forming the photoresist line pattern using a photolithography process.

4. The method according to claim 2, wherein the forming of the photoresist line pattern comprises forming the photoresist line pattern with a line width of 1 to 100 micrometers.

5. The method according to claim 2, wherein the doping of the both sidewalls of the first conductivity-type single crystalline silicon line pattern comprises:

reducing a width of the photoresist line pattern using an isotropic etching process to form an exposed region in which a portion of a top surface of the first conductivity-type single crystalline silicon layer pattern is exposed;

doping the exposed region with impurities of a second conductivity-type to form the second conductivity-type channel; and removing the photoresist line pattern.

6. The method according to claim 5, wherein the reducing of the width of the photoresist line pattern comprises forming the exposed region using an isotropic oxygen plasma etching method.

7. The method according to claim 5, wherein the reducing of the width of the photoresist line pattern comprises forming the exposed region with a width of about 1 to 100 nanometers.

8. The method according to claim 1, wherein the forming of the second conductivity-type pad comprises:

forming a photoresist pattern in a region except both ends of the first conductivity-type single crystalline silicon line pattern;

doping both ends of the first conductivity-type single crystalline silicon line pattern with impurities of a second conductivity-type to form the second conductivity-type pad; and removing the photoresist pattern.

9. The method according to claim 1, wherein the first electrode and the second electrode are formed of a material forming an ohmic contact with each of the undoped region of the first conductivity-type single crystalline silicon pattern and the second conductivity-type channel.

10. The method according to claim 9, wherein the material for forming the ohmic contact is selected from the group consisting of doped polysilicon, metal, conductive metal nitride, and metal silicide.

11. The method according to claim 1, further comprising:

fixing a probe molecule for binding with a target material on the second conductivity-type channel.

12. The method according to claim 11, wherein the probe molecule is fixed by any one selected from the group consisting of an antigen, an antibody, a DNA, a protein, and a combination thereof.

13. The method according to claim 1, wherein the etching of the first conductivity-type single crystalline silicon layer comprises:

forming on the first conductivity-type single crystalline silicon layer a passivation layer which blocks ion implantation and can be removed by wet-etching;

forming a photoresist line pattern on the passivation layer;

dry-etching the passivation layer using the photoresist line pattern as an etch mask to form a passivation layer line pattern;

dry-etching the first conductivity-type single crystalline silicon layer using the photoresist line pattern as an etch mask to form the first conductivity-type single crystalline silicon line pattern; and removing the photoresist line pattern.

14. The method according to claim 13, wherein the forming of the photoresist line pattern comprises forming the photoresist line pattern using a photolithography process.

15. The method according to claim 13, wherein the forming of the photoresist line pattern comprises forming the photoresist line pattern with a line width of 1 to 100 micrometers.

16. The method according to claim 13, wherein the doping of the both sidewalls of the first conductivity-type single crystalline silicon line pattern comprises:

reducing width of the passivation layer line pattern using an wet isotropic etching process to form an exposed region in which a portion of a top surface of the first conductivity-type single crystalline silicon layer pattern is exposed;

doping the exposed region with impurities of a second conductivity-type to form the second conductivity-type channel; and removing the passivation layer line pattern.

17. The method according to claim 16, wherein the reducing of the passivation layer comprises forming the exposed region with a line width of about 1 to 100 nanometers.

18. A semiconductor nanowire sensor device, comprising:

a substrate;

an oxide layer formed on the substrate;

a first conductivity-type single crystalline silicon line pattern formed lengthwise on one region of the oxide layer;

a second conductivity-type channel formed at both sidewalls of the first conductivity-type single crystalline silicon line pattern, the second conductivity-type being opposite the first conductivity-type;

second conductivity-type pads formed at both ends of the first conductivity-type single crystalline silicon line pattern;

a first electrode formed on one region of the first conductivity-type single crystalline silicon line pattern;

a second electrode formed on the second conductivity-type pad; and a probe molecule formed on the second conductivity-type channel for binding with a target material, wherein the first conductivity-type single crystalline silicon line pattern and the second conductivity-type channel are insulated by a reverse-bias voltage applied to the first electrode.

* * * * *